United States Patent
Chung et al.

(10) Patent No.: US 7,511,990 B2
(45) Date of Patent: Mar. 31, 2009

(54) MAGNETIC TUNNEL JUNCTION TEMPERATURE SENSORS

(75) Inventors: Young Sir Chung, Chandler, AZ (US); Robert W. Baird, Gilbert, AZ (US); Mark A. Durlam, Chandler, AZ (US)

(73) Assignee: EverSpin Technologies, Inc., Chandler, AZ (US)

( * ) Notice: Subject to any disclaimer, the term of this patent is extended or adjusted under 35 U.S.C. 154(b) by 201 days.

(21) Appl. No.: 11/240,514

(22) Filed: Sep. 30, 2005

(65) Prior Publication Data

US 2007/0076330 A1    Apr. 5, 2007

(51) Int. Cl.
   *G11C 11/00* (2006.01)
(52) U.S. Cl. ............... 365/158; 365/210.1; 365/209
(58) Field of Classification Search ............ 365/158, 365/210.1, 209
   See application file for complete search history.

(56) References Cited

U.S. PATENT DOCUMENTS

| | | | |
|---|---|---|---|
| 5,940,319 A | 8/1999 | Durlam et al. | |
| 6,630,402 B2 | 10/2003 | Hshieh et al. | |
| 6,667,682 B2 | 12/2003 | Wan et al. | |
| 6,791,865 B2 * | 9/2004 | Tran et al. | 365/158 |
| 6,921,965 B1 * | 7/2005 | Ray et al. | 257/659 |
| 7,079,438 B2 * | 7/2006 | Perner et al. | 365/211 |
| 7,304,360 B2 * | 12/2007 | Guo et al. | 257/422 |
| 2004/0104724 A1 * | 6/2004 | Sato | 324/224 |

* cited by examiner

*Primary Examiner*—Huan Hoang
*Assistant Examiner*—Kretelia Graham
(74) *Attorney, Agent, or Firm*—Ingrassia, Fisher & Lorenz, P.C.

(57) ABSTRACT

An integrated circuit device is provided which includes a heat source disposed in a substrate, and a Magnetic Tunnel Junction ("MTJ") temperature sensor disposed over the heat source.

14 Claims, 8 Drawing Sheets

MAGNETIC TUNNEL JUNCTION TEMPERATURE SENSORS

TECHNICAL FIELD

The present invention relates generally to electronic devices. More particularly, the present invention relates to integrated circuit (IC) devices with smart power devices and magnetoresistive random access memory (MRAM) circuitry which implement magnetic tunnel junctions (MTJs) as temperature sensors or magnetic tunnel junction temperature sensors (MTJ-TSs).

BACKGROUND

MRAM is a nonvolatile memory technology that uses magnetic polarization to store data, in contrast to other RAM technologies that use electronic charge to store data One primary benefit of MRAM is that it retains the stored data in the absence of applied system power, thus, it is a nonvolatile memory. Generally, MRAM includes a large number of magnetic cells formed on a semiconductor substrate, where each cell represents one data bit. Information is written to a cell by changing the magnetization direction of the magnetic free layer within the cell, and a bit is read by measuring the resistance of the cell (low resistance typically represents a "0" bit and high resistance typically represents a "1" bit, or vice versa).

An MRAM device generally includes an array of cells that are interconnected using conductive bit lines, conductive digit lines, and/or local interconnects and the like. Practical MRAM devices are fabricated using known semiconductor process technologies. For example, the bit and digit lines are formed from different metal layers, which are separated by one or more insulating and/or additional metal layers. Conventional fabrication processes allow distinct MRAM devices to be easily fabricated on a substrate.

Smart power integrated circuits are single-chip devices capable of providing operating power in a controlled and intelligent manner. Smart power integrated circuits typically include one or more active circuit components, such as, a power circuit component, an analog control component, and/or a digital logic component. Smart power integrated circuits may also include one or more sensors which can be used to measure or detect physical parameters such as position, motion, force, acceleration, temperature, field, pressure and so forth. Such sensors can be used, for example, to control the output power in response to changing operating conditions. For example, in cell phones, smart power products can be engineered to regulate power consumption, amplify audio signals, and supply power to color screens. In inkjet printers, smart power products can help drive the motors and fire the nozzles for ink delivery. In automobiles, smart power products can help control engine and braking systems, airbag deployments, and seat positioning. Smart power products can also be implemented in a wide variety of other applications.

For integrated circuits (IC's) which implement smart power and magnetoresistive random access memory (MRAM) designs, temperature sensing is an important element of power IC design to protect the circuit, device or system.

FIG. 15 is a simplified schematic cross-sectional representation of a conventional integrated circuit device 1500 implementing a temperature sensor 1502 for sensing temperature. The device consists of a temperature sensor 1502, power source 1504, silicon substrate 1506, an insulating substrate 1508, logic 1514 and a MRAM architecture 1516. Both the temperature sensor 1502 and the power source 1504 are embedded within the silicon substrate 1506 while the insulating substrate 1508 lies above the temperature sensor 1502 and power supply 1504. Existing temperature sensors 1502 for measuring the temperature of a power source 1504 suffer from various limitations. The temperature sensor 102 can be implemented using a junction-based device in which a junction band gap changes with respect to changing temperature. Such p/n junction based sensing devices 1502 consume valuable semiconductor layout area or space. Other limitations of such sensing devices 1502 include, for example, excessive size/weight, inadequate measurement precision, inadequate sensitivity and/or dynamic range, high cost and limited reliability among other limitations.

The miniaturization of many modern applications make it desirable to shrink the physical size of electronic devices, integrate multiple components or devices into a single chip, and/or improve circuit layout efficiency. Ideally, such sensors should be manufactured in a cost effective manner which reduces the additional layout area or space the sensors consumes. It would be desirable to have a semiconductor-based device which includes an MRAM architecture integrated with a smart power architecture including sensor components on a single substrate, particularly where the MRAM architecture and the smart power architecture are fabricated using the same process technology. Thus, there continues to be a need for improved temperature sensors.

Accordingly, it is desirable to provide an improved temperature sensor and method, adaptable for measuring temperature. It is further desirable that the improved temperature sensor and method which generates an electrical signal that can be converted to a temperature of a heat source. It would be desirable to provide temperature sensors that can be easily integrated with semiconductor devices and integrated circuits (e.g., temperature sensors which are compatible with semiconductor device and integrated circuit structures and fabrication methods). For example, it would be very desirable to provide temperature sensors which exhibit precision measurement and improved measurement performance and which can be integrated in a three-dimensional architecture to conserve lay out area and allow for processing in a cost effective manlier. Other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

Figure 1:
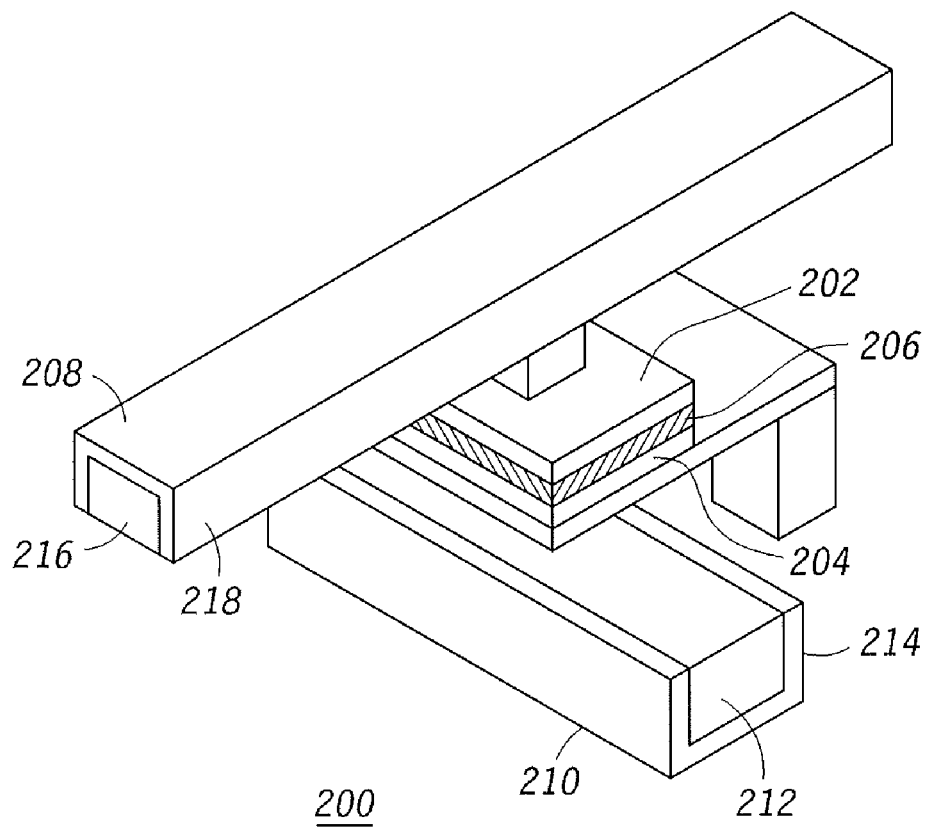
FIG. 1 is a schematic perspective view of an MRAM cell configured according to an exemplary embodiment.

The following detailed description is merely illustrative in nature and is not intended to limit the invention or the application and uses of the invention. As used herein, the word "exemplary" means "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims. Furthermore, there is no intention to be bound by any expressed or implied theory presented in the preceding technical field, background, brief summary or the following detailed description.

For the sake of brevity, conventional techniques and features related to MRAM design, MRAM operation, semiconductor device fabrication, and other aspects of the integrated circuit devices may not be described in detail herein. Furthermore, the circuit/component layouts and configurations shown in the various figures contained herein are intended to represent example embodiments of the invention. It should be noted that many alternative or additional circuit/component layouts may be present in a practical embodiment.

The following description may refer to elements or features being "connected" or "coupled" together. As used herein, unless expressly stated otherwise, "connected" means that one element/feature is directly joined to (or directly communicates with) another element/feature, and not necessarily mechanically. Likewise, unless expressly stated otherwise, "coupled" means that one element/feature is directly or indirectly joined to (or directly or indirectly communicates with) another element/feature, and not necessarily mechanically.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," "right," "in," "out," "front," "back," "up," "down," "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

A practical MRAM architecture can be formed on a substrate using a suitable semiconductor fabrication process. In practice, MRAM structures described herein can be formed using a conventional MRAM fabrication process. A practical MRAM device will typically include millions of cells. Generally, an MRAM architecture includes at least one digit line formed from one metal layer, at least one bit line formed from another metal layer, and a magnetic tunnel junction ("MTJ") core formed between the two metal layers. The MTJ core includes cells that form an array of memory locations for the MRAM architecture.

FIG. 1 is a schematic perspective view of an MRAM cell 200 configured according to an exemplary embodiment. Each cell in an MRAM architecture may be configured as shown in FIG. 1. MRAM cell 200 generally includes either an upper ferromagnetic or synthetic antiferromagnetic ("SAF") layer 202, or a lower ferromagnetic or SAF layer 204, and a tunnel barrier layer 206 between the two ferromagnetic layers. In this example, the upper ferromagnetic or SAF layer 202 composes the free magnetic layer because the direction of its magnetization can be switched to change the bit status of cell 200. Lower ferromagnetic or SAF layer 204, however, is the fixed magnetic layer because the direction of its magnetization is pinned in one direction and does not change direction of polarization during normal operating conditions. When the magnetization in upper ferromagnetic or SAF layer 202 is parallel to the magnetization in lower ferromagnetic layer 204, the resistance across cell 200 is in its low resistance state. When the magnetization in upper ferromagnetic layer 202 is anti-parallel to the magnetization in lower ferromagnetic layer 204, the resistance across cell 200 is in its high resistance state. The data ("0" or "1") in a given cell 200 is read by measuring the resistance of the cell 200. The techniques utilized to read and write data to MRAM cell 200 are known to those skilled in the art and, therefore, will not be described in detail herein.

FIG. 1 also depicts a bit line 208 and a digit line 210 (individually and collectively referred to herein as "program lines") corresponding to cell 200. The orientation of the magnetization in free magnetic layer 202 rotates in response to applied current pulses from the digit and bit lines for toggle applications and makes a complete 180 degree reversal when both digit and bit line pulses are applied simultaneously for the single magnetic free layer (or conventional) application. In a typical non-toggle MRAM, the orientation of the bit is switched by reversing the polarity of the current in bit line 208 while keeping a constant polarity of the current in digit line 210. In a practical deployment, bit line 208 may be connected to any number of similar MRAM cells (e.g., a column of cells) to provide a common write current to each of the connected cells. Similarly, digit line 210 may be associated with any number of similar MRAM cells (e.g., a row of cells) to provide a common digit current to each of the cells.

In the embodiment shown in FIG. 1, magnetic cladding or shielding layers 214, 218 can be provided to improve stability and reduce signal noise/interference due to temperature routings adjacent to the MRAM cell. In this example, digit line 210 includes a conductive digit element 212 and a permeable cladding material 214 formed from a soft magnetic material. In this example, cladding 214 partially surrounds conductive element 212. In particular, cladding 214 is formed around three sides of conductive element 212 such that the upward facing surface of conductive element 212 remains uncladded. In the embodiment shown in FIG. 1, line 208 includes a conductive bit element 216 and cladding 218 formed from a permeable magnetic material. In this example, cladding 218 partially surrounds conductive element 216. In particular, cladding 218 is formed around three sides of conductive element 216 such that the downward facing surface of conductive element 216 remains uncladded. Cladding 214/218 may be utilized to focus the magnetic flux toward the MTJ to improve the efficiency of programming. The cladding has an additional benefit of reducing the write disturbance to neighboring bits. In practical embodiments, the magnetic cladding is an integral part of the barrier layers used in the fabrication of copper program lines used in the MRAM process.

In practical embodiments, conductive element 212 and conductive element 216 are formed from an electrically conductive material such as copper, and cladding 214/218 is formed from a soft, permeable magnetic material such as NiFe, a nickel-iron-cobalt alloy, a cobalt-iron alloy, or the like. In one example embodiment, cladding 214/218 is approximately 200 Angstroms thick (the sidewalls of cladding 214/218 may be slightly thinner). Although the conductive elements and the cladding are realized from different materials, conductive element 212 and cladding 214 are considered to be fabricated at one common metal layer (e.g., the metal four layer), and conductive element 216 and cladding 218 are considered to be fabricated at another common metal layer (e.g., the metal five layer).

The terms "first metal layer" and "second metal layer" may be used herein to differentiate between any two distinct metal layers, and "first metal layer" and "second metal layer" need not indicate the metal one and metal two layers, respectively. In other words, a "first metal layer" means any metal layer within a described integrated circuit device, regardless of any arbitrary layer numbering scheme, and a "second metal layer" means any other metal layer within the described integrated circuit device, regardless of any arbitrary layer numbering scheme.

Smart power integrated circuits can be fabricated using a combinational CMOS process that integrates precision analog, power devices, and logic or a subset of the blocks. Smart power integrated circuits can reduce various components and combine all those functions into a single cost-effective IC including functions of voltage regulation, power MOSFETs, input signal conditioning, transient protection, system diagnostics, and control. ICs using smart power integrated circuits contain various functions, such as power ICs, communication, power management, safety and sensors, and many other special functions. Smart power integrated circuits feature a rich set of mixed signal building blocks including A/D and D/A converters, rail-to-rail op amps, comparators, charge pumps and gate drives, voltage regulators, precision references, digital logic, and non-volatile memory. For driving loads there are power MOSFET devices with inductive energy clamps, independent thermal management, short circuit protection, and diagnostic load sensing.

Figure 2:
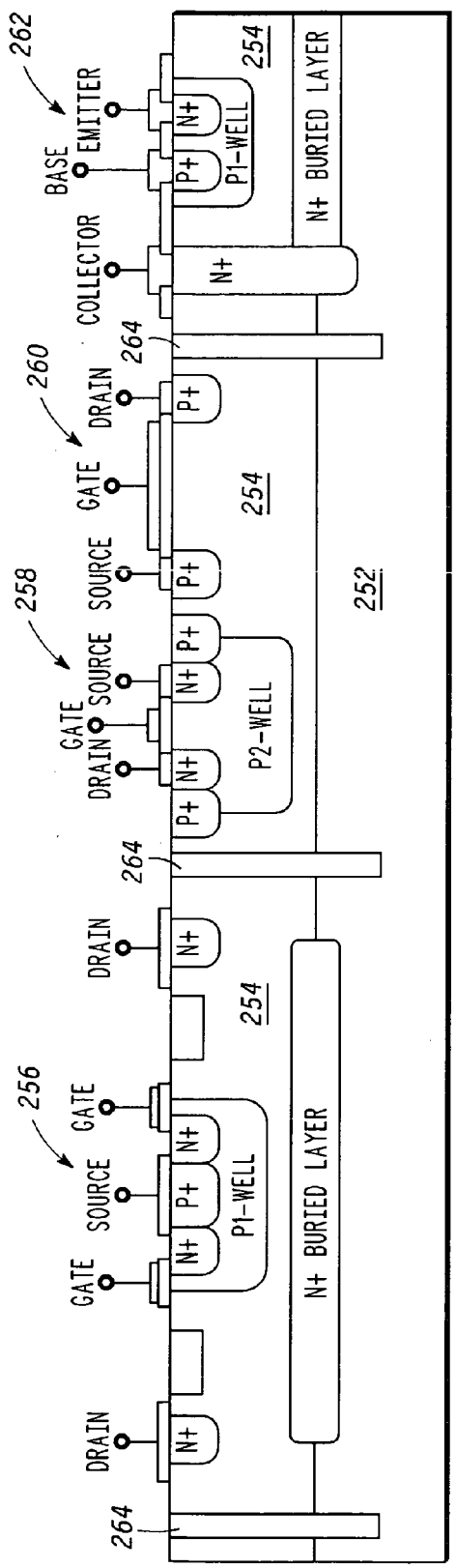
FIG. 2 is a schematic sectional view of a simplified smart power integrated circuit architecture.

FIG. 2 is a schematic view of a simplified smart power integrated circuit architecture 250, which, as an example, is formed on a substrate 252 with an n-epi layer 254 using a suitable semiconductor fabrication process. Smart power integrated circuits can be formed on various types of substrates with and/or without epitaxial layers, employing n-type or p-types. In practice, smart power integrated circuit architecture 250 and other structures described herein can be formed using any suitable integrated circuit fabrication process. Although smart power integrated circuit architecture 250 is depicted with power MOSFET 256, CMOS (n-MOSFET 258 and p-MOSFET 260), and bipolar devices 262, a practical smart power integrated circuit will typically include various active and passive components, such as diodes, resistors, capacitors, inductors, fuses, anti-fuses, and memory devices. Generally, smart power integrated circuit architecture 250 includes at least one metal layer, and additional metal layers are added to increase the circuit density and to enhance circuit performance. Various n-type and p-types wells are formed using well-known semiconductor processing, such as implantation and diffusion. Isolation components 264 could be realized using oxidation and or trench processes.

An embodiment of the invention relates to an integrated circuit device formed on a common substrate and having an MRAM architecture combined with a smart power architecture, where at least a portion of the MRAM architecture and at least a portion of the smart power architecture are concurrently formed by the same fabrication process. As used herein, a smart power architecture includes a power circuit component configured to manage electrical power and at least one additional component configured to control, regulate, monitor, affect, or react to the operation of the power circuit. In practice, the power circuit component may include power transistors, and the at least one additional component may include, without limitation: a sensor (e.g., an environmental condition sensor, an electromagnetic sensor, an electromechanical sensor, an electrical attribute sensor, a transducer, or the like); a power control component; an analog component; a digital logic component; or any combination thereof. Using smart power integrated circuits; designers can reduce the size of the analog portion and the digital logic of practical applications to achieve dense circuitry. This enables designers to economically pack more features and capability into a chip, resulting in reduced die area, reduced cost, and improved performance. This integration helps designers of automotive systems, industrial controls, and consumer electronics simplify system design, lower system cost, and improve reliability.

Figure 3:
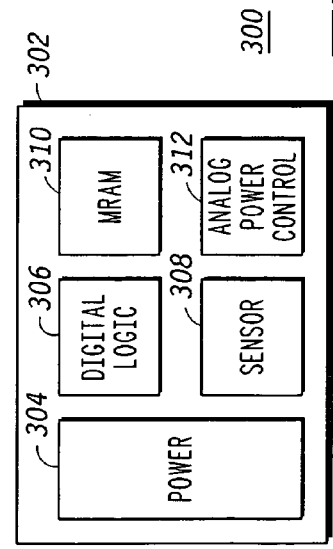
FIG. 3 is a schematic representation of an integrated circuit device configured according to an exemplary embodiment.

FIG. 3 is a schematic representation of an integrated circuit device 300 configured according to an exemplary embodiment. Integrated circuit device 300 generally includes a substrate 302 upon which a number of functional components are formed. Substrate 302 may be any suitable semiconductor material, such as a silicon-based material. The functional components are schematically depicted as blocks in FIG. 3 for ease of illustration. In this example, these functional components include a power circuit component 304, a digital logic component 306, a sensor architecture 308, an MRAM architecture 310, and an analog power control component 312. Although not shown in FIG. 3, integrated circuit device 300 may include additional components as necessary to satisfy the needs of the particular application. In practice, some of these functional components may be coupled together to enable cooperative operation. For example, power circuit component 304, digital logic component 306, sensor architecture 308, and analog power control component 312 may cooperate to form a smart power architecture for integrated circuit device 300. In this regard, these components (individually or in any combination thereof) are also referred to herein as "smart power components." MRAM architecture 310, however, need not be coupled to the other components and MRAM architecture 310 may be configured to function as an independent subsystem of integrated circuit device 300. The embedding of MRAM architecture 310 into a smart power integrated circuit in this manner results in an efficient use of physical space while enabling the fabrication of sensors from layers that are traditionally utilized only in connection with the MTJ core of an MRAM.

In one practical embodiment of the invention, power circuit component 304 includes one or more high power MOSFET devices that are configured to operate at high voltages to generate high temperatures. Alternate embodiments may employ different power generation devices and techniques for power circuit component 304. Digital logic component 306 may be realized with CMOS transistors or any suitable digital logic arrangement. Digital logic component 306 is configured to carry out the digital operations that support the smart power architecture of integrated circuit device 300. Analog power control component 312 includes analog circuit components configured to support the smart power architecture of integrated circuit device 300. Analog power control component 312 may include, for example, resistors, capacitors, inductors, MOSFETs, bipolar devices, and/or other analog circuit elements.

Sensor architecture 308 is generally configured to sense one or more physical, electrical, magnetic, environmental, or other conditions for integrated circuit device 300. In this example, integrated circuit device 300 uses the quantity, characteristic, parameter, or phenomena detected by sensor architecture 308 to regulate, control, manage, or monitor the output power generated by power circuit component 304. In this regard, sensor architecture 308 may employ one or more sensors or sensor components, including, without limitation: an environmental condition sensor, such as a temperature sensor, a humidity sensor, a light sensor, a radiation sensor, or the like; an electromagnetic sensor; an electromechanical sensor, such as a transducer; a mechanical sensor, such as a vibration sensor, an accelerometer, a stress/strain sensor, or the like; a magnetic field sensor; or an electrical attribute sensor, such as a voltage sensor, a temperature sensor, an impedance or resistance sensor, a temperature sensor, a capacitance sensor, an inductance sensor, or the like.

Figure 4:
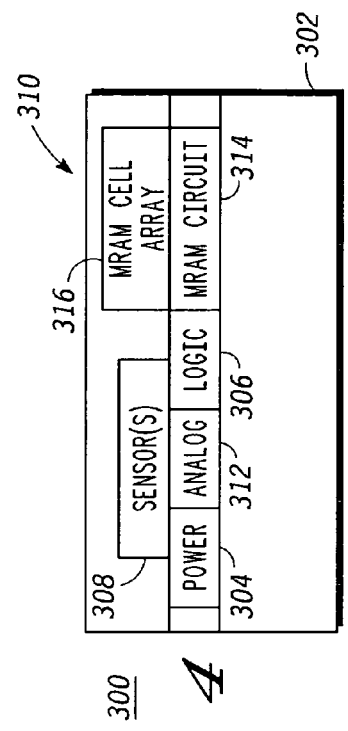
FIG. 4 is a schematic cross sectional representation of the integrated circuit device shown in FIG. 3.

MRAM architecture 310 may be generally configured as described above in connection with FIGS. 1 and 2. Indeed, integrated circuit device 300 may employ conventional MRAM designs and techniques for MRAM architecture 310, and such conventional features will not be described in detail herein. Generally, MRAM architecture 310 includes an MRAM circuit component 314 and an MRAM cell array 316 coupled to MRAM circuit component 314 (see FIG. 4, which is a schematic cross sectional representation of integrated circuit device 300). MRAM circuit component 314 may include any number of elements or features that support the operation of MRAM architecture 310, including, without limitation: switching transistors; input/output circuitry; a decoder; comparators; sense amplifiers, or the like. FIG. 4 is a simplified diagram that generally depicts the topological arrangement of the functional components of integrated circuit device 300. In this regard, FIG. 4 illustrates that MRAM architecture 310 is formed on substrate 302, and that the smart power architecture (including power circuit component 304, digital logic component 316, sensor architecture 308, and analog power control component 312 in this example) is formed on substrate 302. FIG. 4 also illustrates that MRAM cell array 316 is formed above MRAM circuit component 314.

In accordance with the example embodiment of the invention, integrated circuit device 300 is manufactured using a modular process technology having a front end fabrication process and a back end fabrication process. In this context, the front end fabrication process is performed first in time and is completed before the back end process is initiated. As used herein, the front end fabrication process is associated with the formation of elements or features using "front end layers," which may be N and/or P doped regions within a substrate 302, dielectric layers, or other layers, while the back end fabrication process is associated with the formation of elements or features using "back end layers," which may be metal or conductive layers, dielectric layers, MTJ core layers, or other layers. Thus, the front end layers are located in or on the substrate 302, and the back end layers are located above the front end layers. In practice, the front end and back end fabrication processes may utilize well known masking, implantation, diffusion, reactive ion etching, physical sputtering, damascene patterning, physical vapor deposition, electroplating, chemical vapor, and/or plasma enhanced chemical vapor deposition techniques. For example, an integrated circuit as described herein may be manufactured using a process technology that can leverage CMOS, bipolar, or other suitable fabrication processes.

FIG. 4 is a simplified diagram of components and elements of integrated circuit device 300 configured according to an exemplary embodiment. A practical embodiment of integrated circuit device 300 may include additional layers (e.g., metal layers, dielectric layers, and/or a ground plane) than that shown in FIG. 4. In this example, power circuit component 304, analog power control component 312, digital logic component 306, and MRAM circuit component 314 are suitably formed by the front end fabrication process from front end layers. Some or all of these front end components may be concurrently formed by the front end fabrication process. In contrast, sensor architecture 308 (which may include one or more sensors) and MRAM cell array 316 are suitably formed by the back end fabrication process from back end layers. Some or all of these back end components may be concurrently formed by the back end fabrication process. In practice, the front end and back end fabrication processes are modules in the MRAM fabrication process employed to create MRAM architecture 310. Thus, the manufacture of integrated circuit device 300 leverages the existing MRAM fabrication process for purposes of the smart power architecture. In this manner, at least a portion of the smart power architecture and at least a portion of MRAM architecture 310 can be concurrently formed by the chosen MRAM fabrication process.

Figure 5:
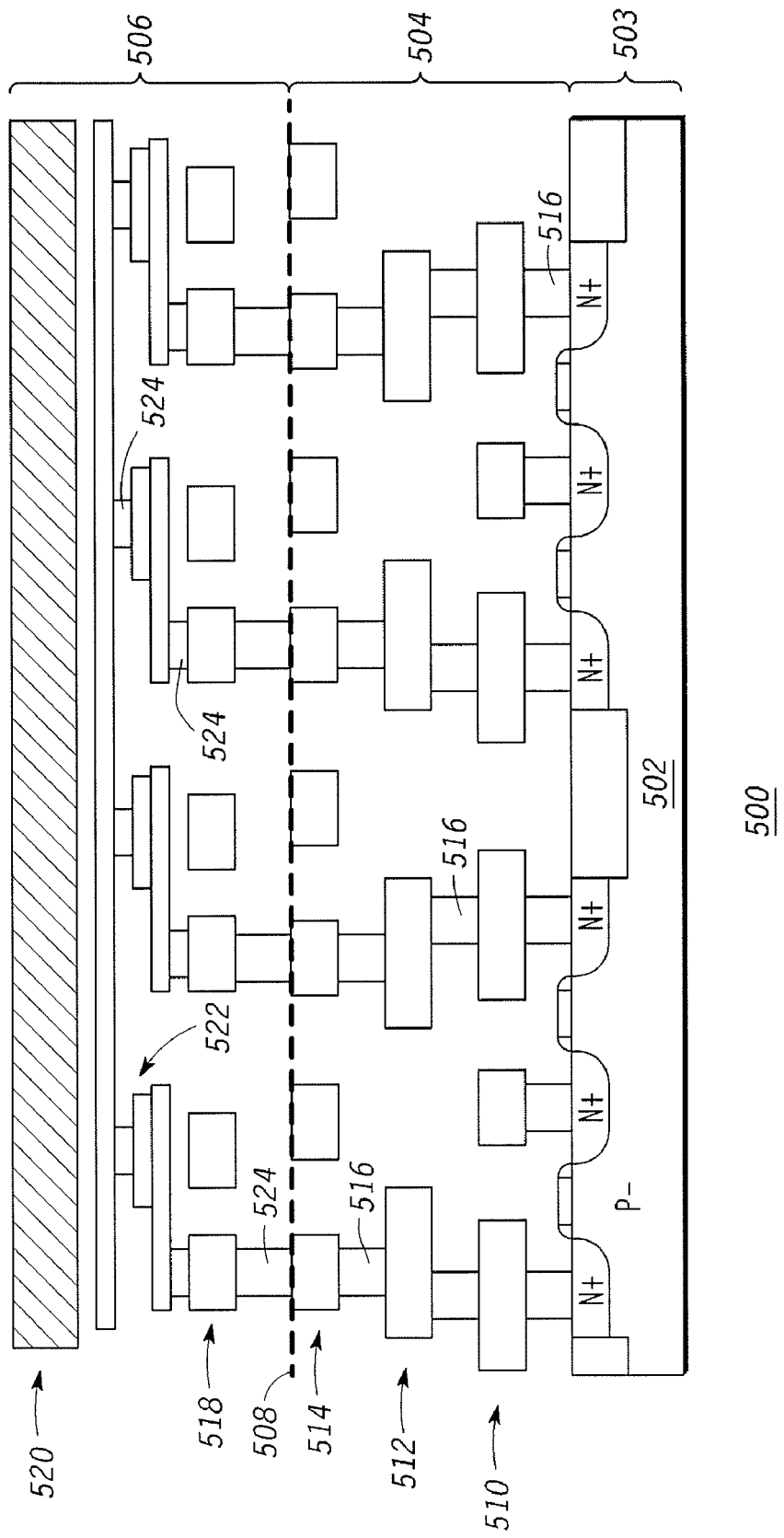
FIG. 5 is a schematic cross sectional representation of an integrated circuit device configured according to an exemplary embodiment.

FIG. 5 is a schematic cross sectional representation of an integrated circuit device 500 configured according to an exemplary embodiment. Integrated circuit device 300 (of FIGS. 3 and 4) may employ the general structure depicted in FIG. 5. Integrated circuit device 500 represents an example MRAM embedded smart power integrated circuit fabricated in the manner described herein. Integrated circuit device 500 generally includes a substrate 502, front end layers 503 formed in or on substrate 502, first back end layers 504 and second back end layer 506 formed above front end layers 503. A dashed line 508 in FIG. 5 represents an imaginary dividing line between the first back end fabrication process and the second back end fabrication process.

In one practical embodiment of the invention, first back end layers 504 of integrated circuit device 500 may include a metal-one layer 510, a metal-two layer 512, a metal-three layer 514, intervening dielectric layers (not separately shown in FIG. 5), conductive vias 516 routed between layers, and the like, while second back end layers 506 of integrated circuit device 500 may include a metal-four layer 518, a metal-five layer 520, an MTJ core "layer" 522, intervening dielectric layers (not separately shown in FIG. 5), conductive vias 524 routed between layers, and the like. As described above, an MTJ core may be realized by more than one layer of material. For the sake of simplicity, however, FIG. 5 depicts the MTJ core as a single "layer" 522. In other embodiments of the invention, integrated circuit device 500 might include more or less front end layers and/or more or less back end layers.

In the example embodiment of FIGS. 3 and 4, power circuit component 304, analog power control component 312, digital logic component 306, and MRAM circuit component 314 are formed using elements created from metal-one layer 510, metal-two layer 512, and/or metal-three layer 514 (of FIG. 5), while sensor architecture 308 and MRAM cell array 316 (of FIGS. 3 and 4) are formed using elements created from metal-four layer 518, metal-five layer 520, and/or MTJ layer 522 (of FIG. 5). MRAM cell array 316 includes a plurality of bit lines formed on metal-five layer 520, a plurality of digit lines formed on metal-four layer 518, and an array of MTJ cells (the MTJ core layer 522 forms the MTJ cells) formed between metal-four layer 518 and metal-five layer 520. In this example, sensor architecture 308 includes a sensor component that is also formed from MTJ core layer 522. In practice, this sensor component is created with the same back end fabrication process used for the creation of MRAM cell array 316. Sensor architecture 308 may also include an additional sensor component (not shown) that is formed from metal-four layer 518 and/or from metal-five layer 520. Such additional sensor components may represent conductive traces, control circuitry, biasing circuitry, or the like.

A sensor in sensor architecture 308 is suitably configured (along with cooperating circuitry or features if necessary) to suit the needs of the particular application. The sensor, which is fabricated from MTJ core layer 522, is designed such that variations in certain operating conditions cause a related change in the electrical, magnetic, electromagnetic, electromechanical, and/or other characteristics of the sensor. For example, an MTJ-based sensor may have certain temperature dependent characteristics, and the layout, topology, and circuit connections to that sensor can be specifically designed to form a temperature sensor. MTJ-based sensors may also have certain characteristics dependent on physical parameters, such as pressure and acceleration. In the embodiment described below with reference to FIGS. 6-14, an MTJ-based device is configured to sense temperature of a nearby heat source based on a current (Isense) sensed by the MTJ core and its associated output resistance (Rout).

MTJ Temperature Sensor Implementation

For integrated circuits (IC's), such as those with smart power and magnetic random access memory (MRAM) circuitry, temperature sensing is a critical element of power IC design since it can protect the circuit, device or system. Many power application IC designs require high precision temperature sensing. In contrast to conventional practices for sensing temperature, which utilize discrete junction-based sensors, the disclosed techniques use a magnetic tunnel junction (MTJ) device as a temperature sensor. The output resistance (Rout), and hence the output current (Isense), of an MTJ device or "bit cell" varies predictably with temperature. An external field generated by the digit line and/or bit line can be used to set or program or change the temperature versus resistance characteristic of an MTJ cell. This property of the MTJ device allows it to be used as a temperature sensor to monitor the temperature of the heat source. Monitoring the temperature of the heat source under various operating conditions can be useful, for example, to protect the heat source in over-power situations. The MTJ device can provide more precise temperature measurements than the conventional junction based device. The use of MTJs as temperature sensors is relatively simple since the MTJ temperature sensor can be formed concurrently with MRAM cells thereby allowing "dummy" MTJ MRAM cells to be used as temperature sensors as opposed to non volatile memory (NVM). The superior temperature characteristics and properties of an MTJ make it ideal for use of an MTJ temperature sensor since it exhibits high-precision temperature sensing or monitoring capability. MTJ-based MRAM bit cells can be utilized to sense the circuit temperature for a variety of purposes. For example, the monitoring capability of the MTJ devices can be utilized to sense the circuit temperature for various circuit monitoring purposes, such as, feedback control, over-temperature protection, and circuit operation shutdown, among others. In general, such MTJ temperature sensors could be utilized to protect components of MRAM embedded SMOS ICs, and other analog and digital circuits which need temperature sensing.

In addition, the MTJ temperature sensors offer excellent design flexibility since the MTJ temperature sensors can be integrated three-dimensionally. This can allow the sensors to be positioned peripherally, vertically or laterally over heat sources or devices, such as active circuits, power devices or "smart power" components. These heat sources are typically fabricated in the substrate of an integrated circuit (e.g., MRAM embedded SMOS power ICs). For example, the MTJ temperature sensor can be disposed anywhere above the substrate near or in the vicinity of active circuit or "smart power" components. This can allow for significant savings of die layout area. These properties can allow for processing in cost effective manner and improve the overall performance of the temperature sensor.

Figure 6:
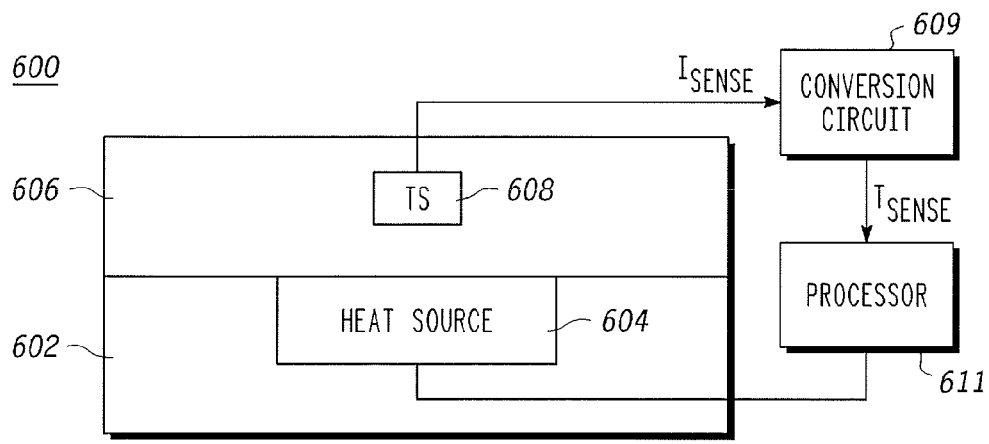
FIG. 6 is a simplified cross-sectional diagram of an integrated circuit device configured according to an exemplary embodiment.

FIG. 6 is a simplified cross-sectional diagram of an integrated circuit device 600 configured according to an exemplary embodiment. A practical embodiment of integrated circuit device 600 may include additional layers (e.g., metal layers, dielectric layers, and/or a ground plane) other than those shown in FIG. 6.

As shown in FIG. 6, the integrated circuit device 600 comprises a dummy MRAM cell (TS) 608 which generates a sensed current (Isense), a heat source 604 which dissipates heat energy from electrical power, a conversion circuit 609 which converts the sensed current (Isense) to a sensed temperature (Tsense), and a processor 611 which uses the sensed temperature (Tsense) to control operation of the heat source 604 and other components (not shown) in the integrated circuit device 600. The heat source 604 can be formed or fabricated in a substrate layer 602, such as a silicon-based layer, while the dummy MRAM cell (TS) 608 can be formed in an insulating layer or layer(s) 606 which is disposed above the substrate layer 602 and separates the dummy MRAM cell (TS) 608 from the heat source 604. Importantly, in this implementation, the dummy MRAM cell (TS) 608 is disposed above the heat source 604 which can allow for 3-D integration and significant layout area savings. The term "dummy" is used herein to distinguish MRAM cells used for sensing applications from conventional MRAM cells used for information storage applications, such as, non-volatile memory (NVM).

In this example, the heat source 604 may comprise, for example, a power circuit component, an analog power control component, or a digital logic component which is formed by a front end fabrication process from front end layers. The heat source 604 can generally be any integrated device which benefits from monitoring of its temperature including, but not limited to, "smart power" components.

In contrast, dummy MRAM cell (TS) 608 is formed by a back end fabrication process from back end layers. In practice, the front end and back end fabrication processes are sub-processes in the MRAM fabrication process employed to create an MRAM architecture (not shown). Thus, the manufacture of integrated circuit device 600 leverages the existing MRAM fabrication process for purposes of the smart power architecture.

Although not show in FIG. 6 for simplicity of illustration, the dummy MRAM cell (TS) 608 generally comprises a digit line, a bit line, and a magnetic tunnel junction ("MTJ") core disposed between said digit line and said bit line such as that shown in FIG. 1. The heat source 604 generates heat energy when operating and is thermally coupled to the dummy MRAM cell (TS) 608 particularly its magnetic tunnel junction core.

Figure 14:
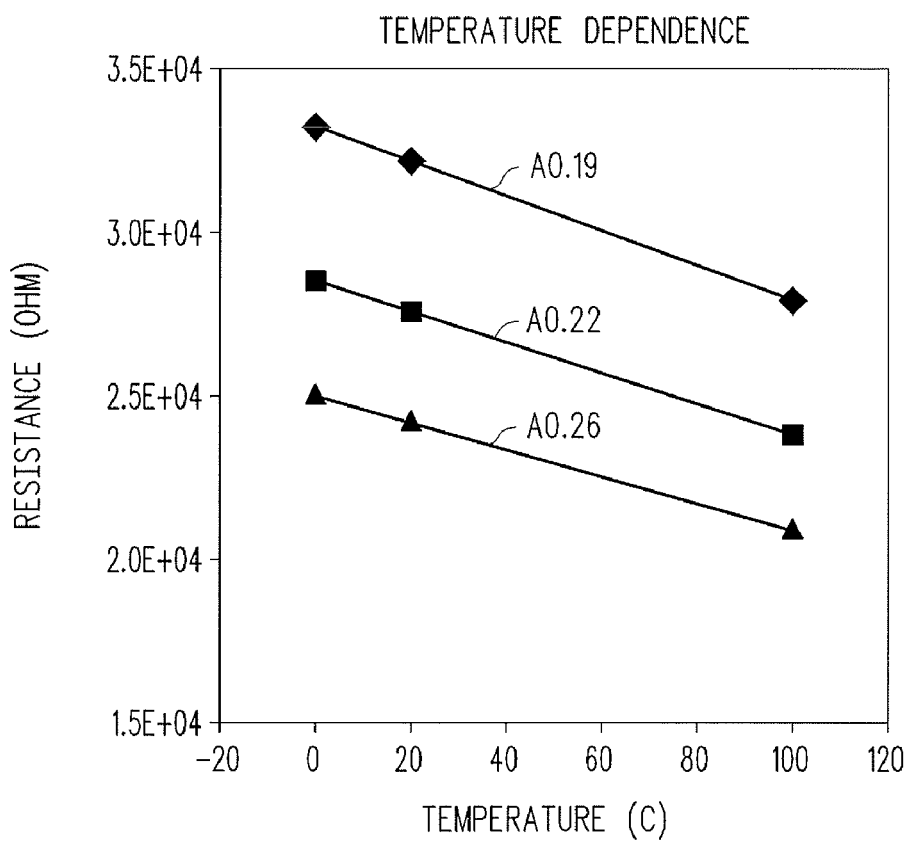
FIG. 14 is a chart illustrating MTJ output resistance with respect to changing temperature.
Figure 15:
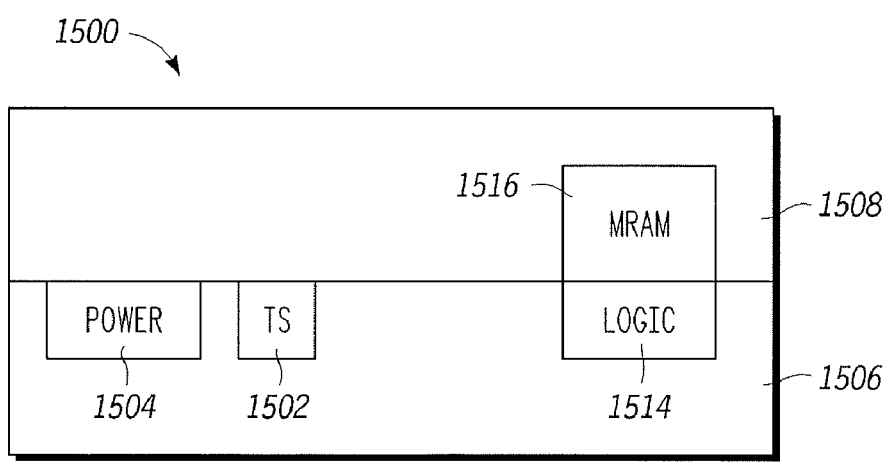
FIG. 15 is a simplified schematic cross sectional representation of a conventional integrated circuit device implementing a temperature sensor.

FIG. 14 is a chart illustrating MTJ output resistance (Rout) with respect to changing temperature. This chart illustrates the dependence of the MTJ output resistance (Rout) with respect to temperature, where the x-axis denotes temperature in Celsius while the y-axis denotes tunnel magnetic resistance (TMR) of MTJs in Ohms. Each line on the graph represents a magnetic tunnel junction having a tunneling area of a given size. Regardless of the size of the magnetic tunnel junction, the output resistance (Rout) of a MTJ device varies as a function of the temperature experienced by the MTJ device (e.g., decreases as temperature increases).

The dummy MRAM cell (TS) 608 uses these properties to provide a three-dimensionally integrated temperature sensor (TS) having an output current (Isense) which can be correlated to a temperature experienced by the dummy MRAM cell (TS) 608 which can therefore be used to sense temperature (Tsense) of the heat source 604. Changes or variations of the current (Isense) can be used to precisely detect and characterize temperature and/or temperature changes in the vicinity of the heat source 604. For example, when the temperature of the heat source 604 increases/decreases, the resistance of the MTJ core 608 decreases/increases and its output current (Isense) increases/decreases. The output resistance (Rout) of the MTJ core 608 varies inversely with respect to the sensed current (Isense) (e.g., the output resistance (Rout) is inversely proportional to the output current (Isense)).

An external field generated by the digit line and/or bit line can be used to set or program or change the temperature versus resistance characteristic of the dummy MRAM cell (TS) 608. Hence, the output resistance (Rout) and the output current (Isense) of an MTJ device or "bit cell" vary predictably with temperature. Thus, when the output tunneling magnetic resistance (TMR) of the dummy MRAM cell (TS) 608 varies, the current (Isense) also varies, and a relationship between the sensed current (Isense) and the temperature experienced by the dummy MRAM cell (TS) 608 can be determined and used to sense temperature.

In one embodiment, the conversion circuit 609 measures the output current (Isense) and uses the measured output current (Isense) to determine a corresponding output resistance (Rout) of the MTJ device. Because the relationship between the output resistance (Rout) of the MTJ device and the temperature (Tsense) sensed by the MTJ device can be programmed and is known, the conversion circuit can determine the temperature (Tsense) sensed by the MTJ device. Temperature can monitored/sensed by observing a difference between the current (Isense) and a reference. Thus, the conversion circuit 609 can precisely associate the current (Isense) with a corresponding "sensed" temperature (Tsense), and provide the sensed temperature to a processor 611 which can make adjustments to the operation of the integrated circuit 600 if necessary, for example, to protect the heat source in over-power situations.

Figure 7:
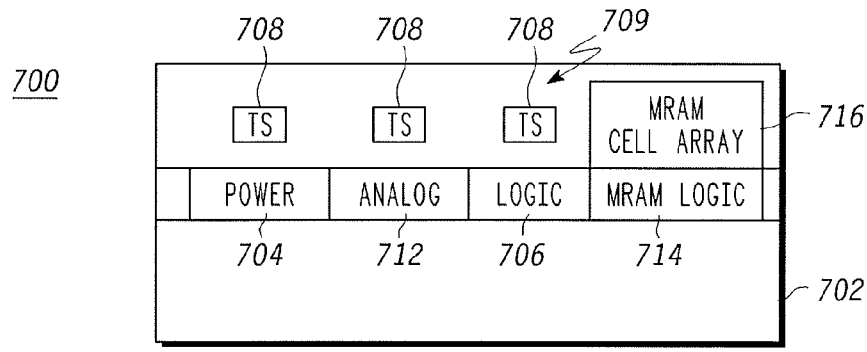
FIG. 7 is a simplified cross-sectional diagram of an integrated circuit device configured according to an exemplary embodiment.

FIG. 7 is a simplified cross-sectional diagram of an integrated circuit device 700 configured according to an exemplary embodiment. In this embodiment, a number of magnetic tunnel junction (MTJ) temperature sensors 708 can be implemented in conjunction with "smart power" IC's 704, 706, 712 and MRAM circuitry 714, 716. A practical embodiment of integrated circuit device 700 may include additional layers (e.g., metal layers, dielectric layers, and/or a ground plane) other than those shown in FIG. 7. Moreover, implementations of the integrated circuit device 700 can include a conversion circuit (not shown) for converting the sensed current (Isense) to a sensed temperature (Tsense), and a processor (not shown) for controlling operation of the integrated circuit device 700 in response to the sensed temperature (Tsense).

The integrated circuit device 700 comprises a substrate 702, a magnetic random access memory ("MRAM") architecture 714, 716 formed on said substrate 702, a sensor architecture comprising dummy MRAM cells 708 formed on and/or above said substrate 702, and active circuit components 704, 706, 712 formed within the substrate. The MRAM architecture may comprise an MRAM logic circuitry 714 and an MRAM cell array 716.

As noted above, the MRAM cell array 716 comprises a plurality of MRAM cells. Each of the plurality of MRAM cells may comprise a number of components which are not shown in FIG. 7 for simplicity of illustration. For instance, as described above with respect to FIG. 1, each MRAM cell may comprise a digit line formed from said first metal layer; a bit line formed from said second metal layer; and a magnetic tunnel junction ("MTJ") core formed between said first metal layer and said second metal layer.

In this description, the term "particular" is used to distinguish between components of the dummy MRAM cells used for temperature sensing applications and corresponding components of the regular MRAM cells used for storage purposes, such as, non-volatile memory (NVM). Each of the dummy MRAM cells 708 or temperature sensors (TSs) comprise the same components as the MRAM cells and are fabricated concurrently with the MRAM cells of the MRAM cell array 716. Again, these components of the dummy MRAM cells are not shown in FIG. 7 for simplicity of illustration, however, each particular dummy MRAM cell may include a particular digit line formed from a first metal layer, a particular bit line formed from a second metal layer, and a particular magnetic tunnel junction ("MTJ") core disposed between said first metal layer and said second metal layer.

The active circuit components are sometimes referred to as "smart power" components, and may comprise, for example, a power circuit component 704, an analog power control component 712, and a digital logic component 706. Each of the active circuit components can be formed within the substrate 702, and each particular magnetic tunnel junction core or temperature sensor (TS) 708 can be formed, for example, above or over a corresponding active circuit component 704, 706, 712 to conserve lay out area. Alternatively, each particular magnetic tunnel junction core or temperature sensor (TS) 708 can be formed, for example, adjacent a corresponding active circuit component 704, 706, 712. The corresponding active circuit components 704, 706, 712 generate thermal energy at a given temperature by dissipating power. The temperature can be sensed by the dummy MRAM cells 708. The dummy MRAM cells 708 have a resistance (Rout) associated with them which varies as a function of temperature (see FIG. 14). Because the resistance versus temperature characteristic of the MTJ core or cell can be programmed or otherwise determined, the current (Isense) can be associated with the resistance (Rout) of the MTJ core/cell which can be correlated to a temperature experienced by the dummy MRAM cells 708. An intrinsic property of the magnetic tunnel junction, known as the output tunneling magnetic resistance (TMR) of the magnetic tunnel junction, varies as a function of its internal temperature. By monitoring the output resistance (Rout) of a magnetic tunnel junction, the fluctuations in temperature may also be monitored. This can be accomplished, for example, via a conversion circuit (not shown) configured to observe and characterize values of the current (Isense) which flows through the MTJ core. The conversion circuit can determine the resistance value (Rout) of the MTJ core/cell based on the current (Isense). From the resistance value (Rout), the conversion circuit can determine an associated or corresponding temperature value by correlating the resistance value to a temperature. As such, the MTJ cell/core can be used in conjunction with a conversion circuit as a "temperature sensor" to determine a temperature of the power circuit component 704, the analog power control component 712, and the digital logic component 706.

In the exemplary embodiment shown in FIG. 7, the power circuit component 704, analog power control component 712, digital logic component 706, and MRAM circuit component 714 are suitably formed by a front end fabrication process from front end layers. Some or all of these front end components may be concurrently formed during the front end fabrication process. The front end components can be partially or completely disposed on the substrate 702 or partially or completely embedded in the substrate 702.

In contrast, sensor architecture 709 (which may include one or more sensors 708) and MRAM cell array 716 are formed by the back end fabrication process from back end layers. The sensor architecture 709 is typically disposed or embedded in an insulating layer, such as an interlayer dielectric, which resides above the substrate 702. As described above, "back end" layers are layers formed after "front end" layers. Some or all of these back end components may be concurrently formed by the back end fabrication process. In practice, the front end and back end fabrication processes are sub-processes in the MRAM fabrication process employed to create MRAM architecture. Thus, the manufacture of integrated circuit device 700 leverages the existing MRAM fabrication process for purposes of the smart power architecture.

In this manner, at least a portion of the smart power architecture and at least a portion of MRAM architecture can be concurrently formed by the chosen MRAM fabrication process. This approach also allows for three-dimensional (3-D) integration of the sensor architecture 709. For instance, FIG. 7 illustrates that the MTJ current sensor 708 can be placed above the power dissipating devices 704, allowing area saving in the silicon substrate. As mentioned before, the area savings allows enhancement in productivity.

The MTJ temperature sensor 708 also provides significant design flexibility. The temperature experienced by the MTJ cell/core is dependent upon the distance between the MTJ and the power dissipating heat source. The respective distances between the MTJ cell/core, the write current lines (bit line and digit line), and the temperature sources 704, 706, 712 can be controlled during the fabrication process. By modifying these distances sensitivity of the temperature sensor may be adjusted to fit design needs.

Figure 8:
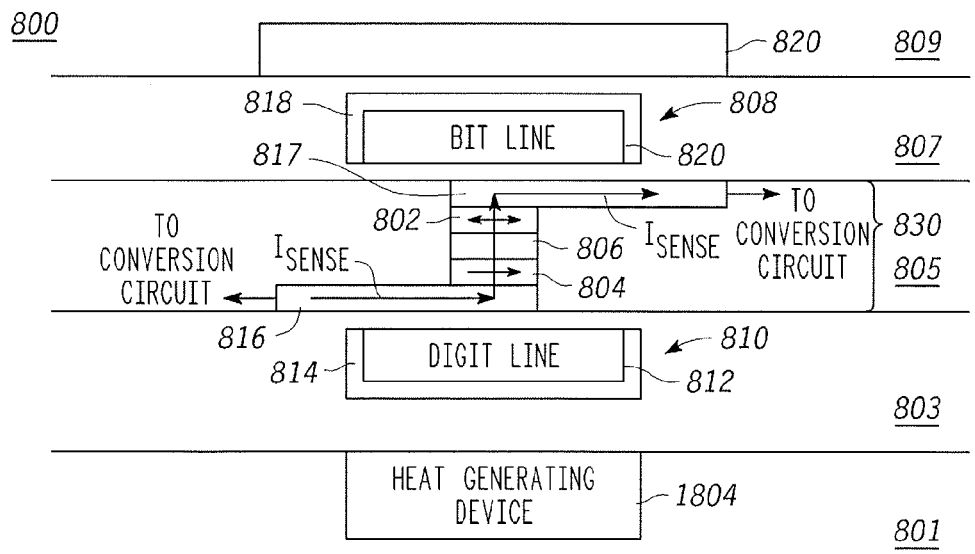
FIG. 8 is a simplified cross-sectional diagram of an integrated circuit configured according to an exemplary embodiment which implements a MTJ core temperature sensor for sensing temperature of an associated heat source or heat generating device.

FIG. 8 is a simplified cross-sectional diagram of an integrated circuit 800 configured according to an exemplary embodiment which implements a MTJ core temperature sensor 830 for sensing temperature of an associated heat source or heat generating device 1804, such as an active circuit (or "smart power") component.

The integrated circuit 800 comprises a substrate 801, a magnetic tunnel junction temperature sensor 830, a first insulating layer 803, a digit line (DL) 810, a heat generating device 1804, a second insulating layer 805, a third insulating layer 807, a bit line (BL) 808, a fourth insulating layer 809, and a magnetic shielding layer 820.

The magnetic tunnel junction temperature sensor 830 associated with the heat generating device 1804 is thermally coupled to that heat generating device 1804. The output tunneling magnetic resistance (TMR) of the magnetic tunnel junction core 830 varies predictably as a function of its internal temperature. By monitoring the output TMR (Rout) of a magnetic tunnel junction core, the fluctuations in temperature may be monitored.

To explain further, the magnetic tunnel junction core temperature sensor 830 responds to changes in the temperature of the heat generating device 1804. In particular, the resistance (Rout) of a magnetic tunnel junction core 830 varies as a function of the temperature generated by the heat generating device 1804 As such, the magnetic tunnel junction core temperature sensor 830 can sense the current (Isense) which can then be used to generate a sensed temperature (Tsense).

The MRAM cell 830 comprises a free magnetic layer 802, tunnel barrier 806, pinned magnetic layer 804, and electrode layers 816, 817 (FIG. 8). The "free" magnetic layer 802 can be formed of either an upper ferromagnetic or synthetic anti-ferromagnetic ("SAF") layer, the "pinned" magnetic layer 804 can be formed of either a lower ferromagnetic or SAF layer, and the tunnel barrier layer 806 can be disposed between the free layer 802 and the pinned layer 804 such that it sits between the free layer 802 and the pinned layer 804. The pinned layer 804 can be made of a NiFe material and can have a fixed orientation of magnetization (to the right in FIG. 8). The free layer 802 can be made of NiFe, and unlike the pinned layer, the orientation of the magnetization in the free layer can point in either the left or the right direction in FIG. 8. The tunnel barrier "tunnels" current from the pinned layer to the free layer and may comprise an oxide. Electrode 816 sits below the pinned layer 804, while electrode 817 sits above the free layer 802.

FIG. 8 also depicts a bit line 808 and a digit line 810 (individually and collectively referred to herein as "program lines") corresponding to cell 830. The orientation of the magnetization in free magnetic layer 802 rotates in response to applied current pulses from the digit and bit lines for toggle applications and makes a complete 180 degree reversal when both digit and bit line pulses are applied simultaneously for the single magnetic free layer (or conventional) application. In a typical non-toggle MRAM, the orientation of the bit is switched by reversing the polarity of the current in bit line 808 while keeping a constant polarity of the current in digit line 810. Magnetic cladding or shielding layers 814, 818 can optionally be provided to improve stability and reduce signal noise/interference due to routings adjacent to the MRAM cell. In this example, digit line 810 includes a conductive digit element 812 and a permeable cladding material 814 formed from a soft magnetic material. The cladding 814 partially surrounds conductive element 812 around three sides of conductive element 812 such that the upward facing surface of conductive element 812 remains uncladded. Line 808 includes a conductive bit element 820 and cladding 818 formed from a permeable magnetic material. The cladding 818 partially surrounds conductive element 820 around three sides of conductive element 820 such that the downward facing surface of conductive element 820 remains uncladded. Cladding 814/818 may be utilized to focus the magnetic flux toward the MTJ to improve the efficiency of programming. The cladding has an additional benefit of reducing the write disturbance to neighboring bits. In practical embodiments, the magnetic cladding is an integral part of the barrier layers used in the fabrication of copper program lines used in the MRAM process.

In practical embodiments, conductive element 812 and conductive element 820 are formed from an electrically conductive material such as copper, and cladding 814/818 is formed from a soft, permeable magnetic material such as NiFe, a nickel-iron-cobalt alloy, a cobalt-iron alloy, or the like. In one example embodiment, cladding 814/818 is approximately 830 Angstroms thick (the sidewalls of cladding 814/818 may be slightly thinner). Although the conductive elements and the cladding can be realized from different materials, conductive element 812 and cladding 814 are considered to be fabricated at one common metal layer (e.g., the metal four layer), and conductive element 820 and cladding 818 are considered to be fabricated at another common metal layer (e.g., the metal five layer).

In addition, an additional thick magnetic shielding layer or layers 820 can be provided over the MTJ core temperature sensor 830. The thick magnetic shielding layer 820 is placed above the MTJ temperature sensor to protect the MTJ temperature sensor 830 from external noise so that the MTJ temperature sensor 830 senses the particular temperatures which are associated with the heat source or heat generating device 1804 to be sensed. The additional thick magnetic shielding layer 820 can protect the current signal (Isense) from external noise caused by external sources. This can allow for more precise measurements. The magnetic shielding layer 820 improves the signal noise and stability of the MTJ output resistance by eliminating signal interferences due to current routings adjacent the device. The magnetic shielding layer 820 reduces the effects of unwanted the magnetic fields in the regions where the current signal (Isense) can be susceptible to external noise. The MTJ current sensor can produce even more precise measurements when the noise is reduced due to the magnetic shielding layer 820.

The heat generating device 1804 is thermally coupled to the magnetic tunnel junction core temperature sensor 830. As described below, the digit line 810, provided below the MTJ, and the bit line 820, provided above the MTJ, allow for initial setting or programming of the temperature versus resistance characteristic of the MTJ device 830.

As will now be described with respect to FIGS. 9-11 and with reference to FIG. 1, when implementing the MTJ core temperature sensor 202, 204, 206, temperature sensor stability can be further improved by modifying or varying the geometry of electrodes 202, 204 of the MTJ core temperature sensor 202, 204, 206. For example, variables such as the aspect ratio, relative orientation, size and shape of the electrodes 202, 204 of the MTJ core temperature sensor 202, 204, 206 can be varied.

Figure 9:
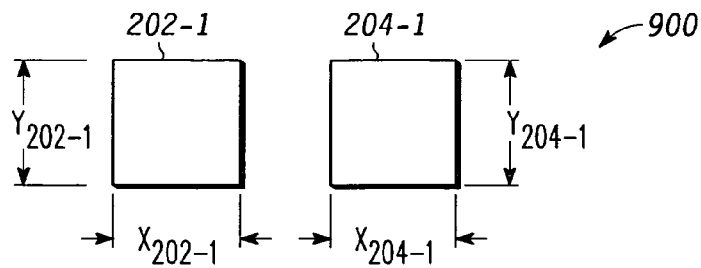
FIG. 9 is an exploded plan view of the electrodes of a MTJ configured according to exemplary embodiments.
Figure 9:
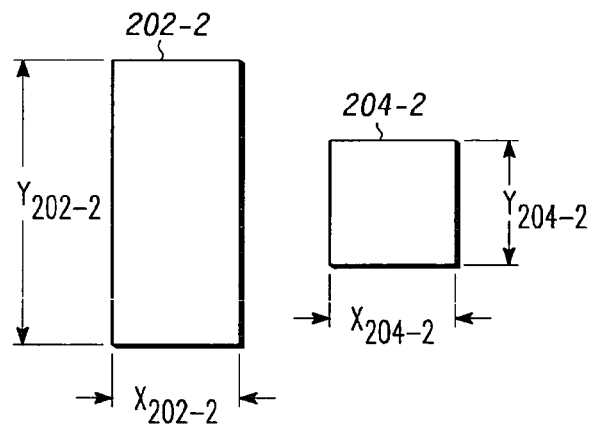

FIG. 9 is an exploded plan view 900 of the electrodes 202, 204 of an MTJ core temperature sensor 202, 204, 206 configured according to exemplary embodiments where at least one of the electrodes is square. Electrodes 202, 204 are shown as being laterally displaced in FIG. 9 so that their relative shape and size may be more easily seen. However, when assembled to form MTJ core temperature sensor 202, 204, 206, they lie one above the other, that is, electrode 204 above electrode 202. Electrodes 202-1, 204-1 are shown as being substantially square, that is having X and Y dimensions $Y_{202-1}=X_{202-1}=Y_{204-1}=X_{204-1}$. For convenience of explanation, this is the representation that has been used up to now for the most part, but that is not essential. Electrodes 202-2, 204-2 are different with electrode 202-2 being rectangular with $Y_{202-2}>X_{202-2}$ and $Y_{204-2}=X_{204-2}$. Again, this is intended merely to be illustrative of various possible shapes of the electrodes and not to be exhaustive or limiting.

Figure 10:
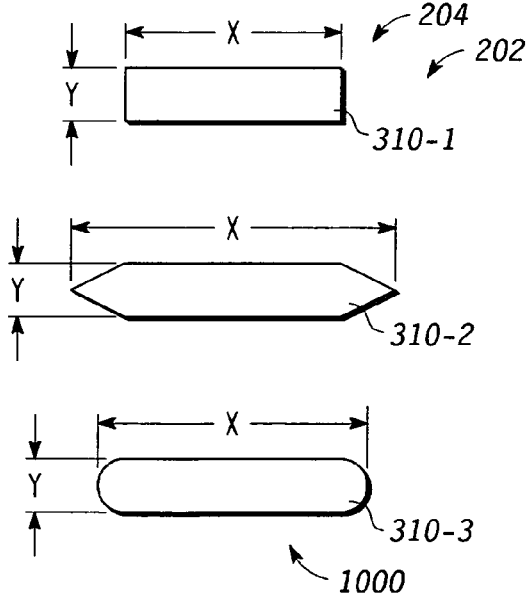
FIG. 10 is an exploded plan view of the electrodes of a MTJ configured according to other exemplary embodiments.

FIG. 10 is an exploded plan view 1000 of the electrodes 202, 204 of a MTJ configured according to other exemplary embodiments where either or both electrodes 202, 204 have various exemplary, non-square, shapes. For example, in 310-1, either or both of electrodes 202, 204 are rectangular and elongated with dimension X significantly greater then Y, in 310-2, either or both of electrodes 202, 204 are elongated with X>>Y and with triangular ends, and in 310-3, either or both of electrodes 202, 204 are elongated with X>>Y and with rounded ends. When electrodes are placed one above the other to form MTJ core temperature sensor 202, 204, 206, their longer dimensions may make various angles with respect to each other, as is illustrated schematically in FIG. 11. It is useful under certain circumstances to use electrode shapes that are significantly asymmetric since the plan view asymmetry in thin electrodes affects the ease or difficulty with which the electron spin axes may be rotated. For example, although the electron spin axes in the first electrode can be pinned by heat treatment in the presence of a magnetic field, another approach is to make the electrode shape highly asymmetric, e.g., long and narrow in plan view, since it is very difficult to rotate the electron spin axes away from the long direction of such an asymmetric shape. However, either arrangement for pinning the spin axes may be used.

Figure 11:
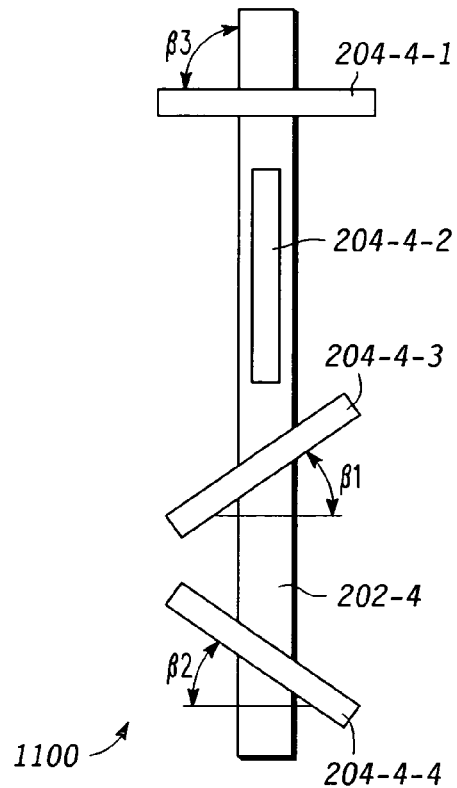
FIG. 11 is a plan view of an arrangement of the electrodes of a MTJ configured according to yet other exemplary embodiments.

FIG. 11 shows plan view 1100 of an arrangement of the electrodes 202, 204 of a MTJ configured according to yet other exemplary embodiments where at least one of the electrodes 202, 204 has various angular arrangements with respect to the other electrode. For convenience of illustration first electrode 202-4 is shown as a single continuous electrode, with various segmented second electrodes 204-4-1 . . . 204-4-4 crossing it at different angles. In other embodiments, the electrode 202-4 can be composed of separate segments, each underlying a single one of second electrodes 204-4-1 . . . 204-4-4. Second electrode 204-4-1 is oriented with its long dimension substantially orthogonal to the long dimension of first electrode 202-4 at angle β-3. Second electrode 204-4-2 is oriented with its long dimension substantially parallel (or anti-parallel) with the long dimension of first electrode 202-4.

Second electrode 204-4-3 is oriented with its long dimension at angle β-1 and second electrode 204-4-4 is oriented with its long dimension at angle β-2 with respect to the long dimension of first electrode 202-4. Thus, a wide variety of different relative angular orientations may be used for the first and second electrodes 202, 204.

Figure 12:
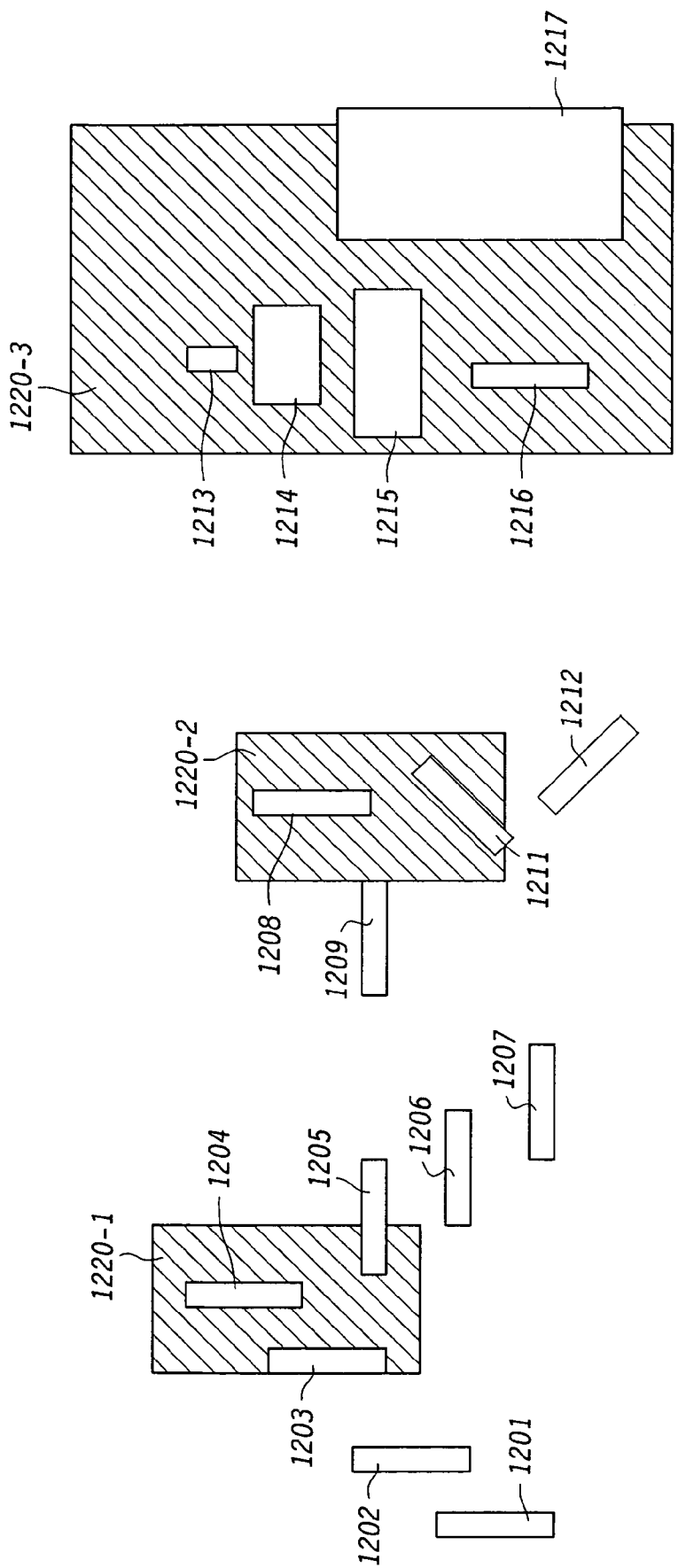
FIG. 12 is a simplified top view of an integrated circuit device implementing magnetic tunnel junction (MTJ) temperature sensors over a heat source.

FIG. 12 shows simplified top views of an integrated circuit device implementing magnetic tunnel junction (MTJ) temperature sensors 1201-1217 over a heat or "power dissipation" sources 1220-1, 1220-2, and 1220-3. Performance of the MTJ core temperature sensor can also be further improved by optimizing or varying variables such as the proximity of the MTJ core temperature sensors 1201-1207 with respect to the temperature source 1220-1 to be sensed, the angles/orientation of the MTJ core temperature sensors 1208-1212 with respect to the temperature source 1220-2 to be sensed, and sizes of the MTJ core temperature sensors 1213-1217 with respect to the temperature source 1220-3 to be sensed. Performance of MTJ temperature sensor device 1201-1217 can be improved by optimizing positions, angles and coverage of the MTJ temperature sensor device with respect to the heat source or power dissipation source of interest.

Figure 13:
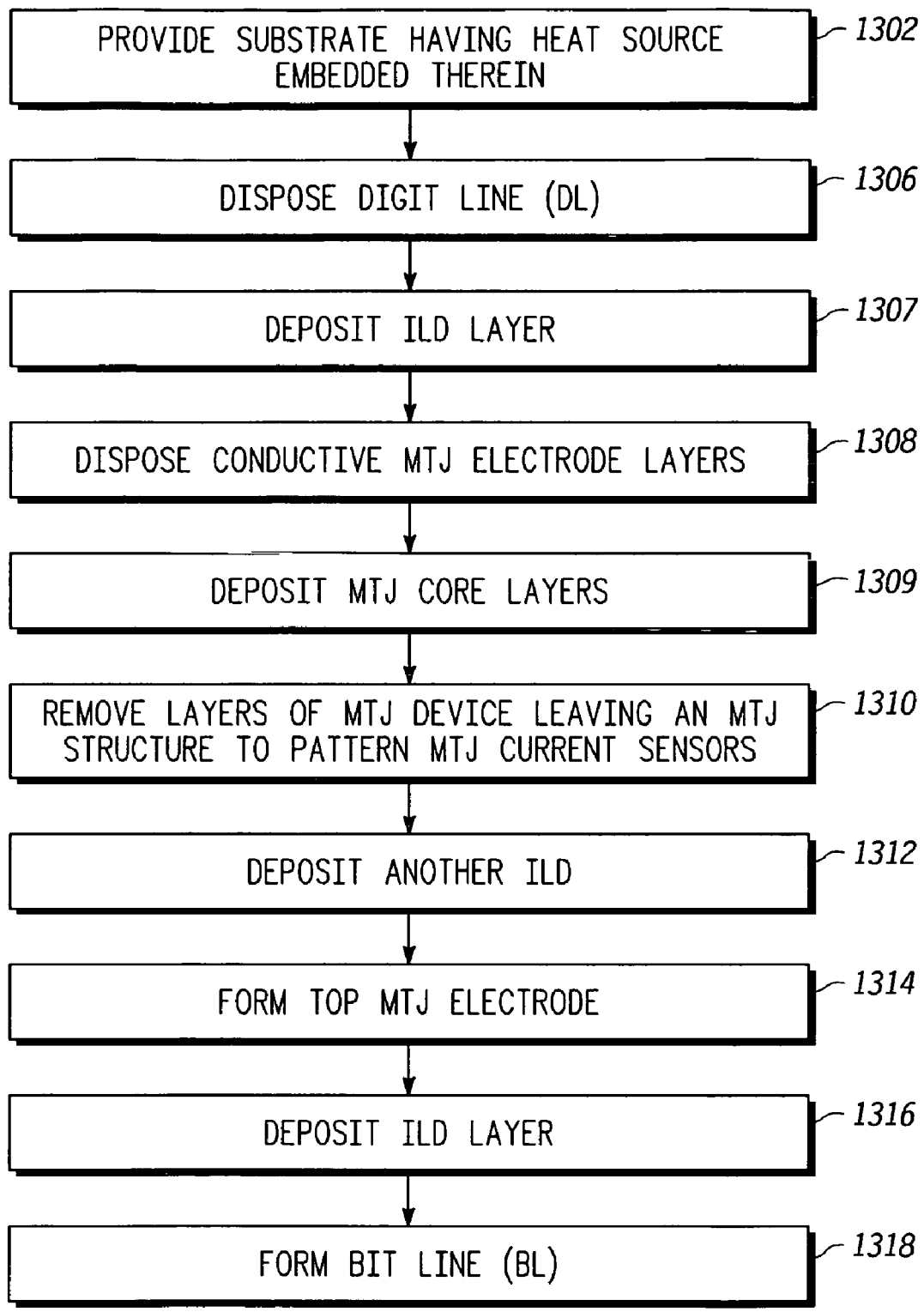
FIG. 13 is a flowchart showing a method of fabricating an MTJ core temperature sensor according to an exemplary embodiment.

FIG. 13 is a flowchart showing a method of fabricating an MTJ core temperature sensor according to an exemplary embodiment and will be described with reference to the cross-section illustrated in FIG. 8. At step 1302, a substrate 801 is provided which has active circuit components or devices 804, such as, smart power or analog integrated circuits, embedded therein. At step 1306, a digit line (DL) 810 with magnetic cladding 814 is then disposed using known semiconductor processing techniques. This can happen, for example, via physical vapor deposition and electroplating to deposit, for example, copper materials. At step 1307, a first insulator layer 803, such as an inter-level dielectric (ILD) layer, is deposited. At step 1308, a conductive MTJ electrode layer 816 can then disposed using known semiconductor processing techniques such that it is spaced from the DL 810 by the first insulator layer. The bottom MTJ electrode 816 can then be patterned as needed. The bottom MTJ electrode 816 may comprise, for instance, Ta metal. At step 1309, the layers 804, 806, 802, which eventually comprise the MTJ core, are successively deposited on the bottom MTJ electrode 816. At step 1310, part of the layers 804, 806, 802 can be removed using known lithography techniques, leaving an MTJ structure which includes a free layer 802, a tunnel barrier 806 and a pinned layer 804. At step 1312, another insulator layer, such as an ILD, is deposited over the free layer 802. At step 1314, the top MTJ electrode 817 is disposed and patterned using known semiconductor processing techniques. At step 1316, another inter-level dielectric layer is disposed over the top MTJ electrode 817. At step 1318, a conductive bit line (BL) 820 is then disposed using known semiconductor processing techniques with magnetic cladding layers or magnetic shielding or both. The DL 810 and/or the BL 820 can be used to initially program or set the resistance versus temperature characteristic of the MTJ core 830. An external field generated by the digit line and/or bit line can be used to set or program or change the temperature versus resistance characteristic of an MTJ cell.

In summary, systems, devices, and methods configured in accordance with example embodiments of the invention relate to temperature sensing techniques.

According to one embodiment, an integrated circuit device is provided which comprises a heat source disposed in a substrate, and a Magnetic Tunnel Junction ("MTJ") temperature sensor disposed over the heat source.

According to another embodiment, an integrated circuit device is provided which comprises a heat source that generates heat that can vary in temperature, and a dummy MRAM cell disposed proximate the heat source, the dummy MRAM cell comprising a particular magnetic tunnel junction ("MTJ") core configured to generate a current which varies as a function of the temperature.

According to yet another embodiment, an integrated circuit device is provided which comprises a substrate, a heat source formed within the substrate and having a temperature, and a magnetic random access memory ("MRAM") architecture formed on the substrate. The MRAM architecture comprises an MRAM cell array and a dummy MRAM cell. The dummy MRAM cell comprises a particular magnetic tunnel junction ("MTJ") core formed above the heat source and configured to generate a current which varies with respect to the temperature of the heat source.

According to still another embodiment, an integrated circuit device is provided which comprises a heat source having a temperature and configured to generate heat energy, a temperature sensor disposed over the heat source, and a temperature sensor circuit configured to associate a value of the current with a corresponding temperature of the heat source. The temperature sensor comprises a Magnetic Tunnel Junction ("MTJ") core having a resistance value which varies as a function of the temperature of the heat source, and being configured to generate a current which varies with the resistance value of the particular MTJ core.

In one implementation, an integrated circuit device is provided which comprises a substrate, a heat source formed within the substrate, and a dummy MRAM cell comprising a particular magnetic tunnel junction ("MTJ") core. The heat source is configured to generate heat energy and has a temperature. The heat source can be formed from front end layers by a front end fabrication process. The heat source may comprise, for example, at least one of an active circuit component, a power circuit component, a power control component or a logic component.

A resistance value of the particular magnetic tunnel junction core varies with the temperature. The particular magnetic tunnel junction core responds to changes in the temperature of the heat source, and is configured to sense the temperature and generate a current responsive to the temperature. A resistance value of the particular magnetic tunnel junction core can vary in response to changes of the heat energy generated by the heat source such that the resistance value of the particular magnetic tunnel junction core varies as a function of the temperature of the heat source. The current varies based on the resistance value of the particular magnetic tunnel junction core. The current of the particular magnetic tunnel junction core is used to determine a corresponding temperature of the heat source.

A temperature sensor circuit can be configured to associate the current generated by the particular magnetic tunnel junction core with a corresponding temperature which indicates the temperature of the heat source.

In one embodiment, the dummy MRAM cell further comprises a first conductive layer and a second conductive layer, and the particular MTJ core is disposed between the first conductive layer and the second conductive layer. The first conductive layer further may also comprise a first magnetic shielding layer disposed below the particular magnetic tunnel junction core, and the second conductive layer may further comprise a second magnetic shielding layer disposed above the particular magnetic tunnel junction core.

An MRAM cell array can also be provided which comprises a plurality of MRAM cells. Each of the plurality of MRAM cells comprises the first conductive layer, the second conductive layer, and a magnetic tunnel junction ("MTJ") core formed between the first conductive layer and the second conductive layer, wherein each MTJ core is substantially identical to the particular MTJ core of the dummy MRAM cell. The MRAM cell array and the particular magnetic tunnel junction core can be formed from back end layers by a back end fabrication process which occurs after the front end fabrication process. In one implementation, the particular magnetic tunnel junction core can be formed above the heat source and thermally coupled to the heat source.

In one implementation, the particular magnetic tunnel junction core comprises a first electrode, and a second electrode, and a resistance versus temperature characteristic of the particular magnetic tunnel junction core varies based on at least one of a location of the first electrode or the second electrode with respect to the first conductive layer or the second conductive layer, proximity of the first electrode or the second electrode with respect to the first conductive layer or the second conductive layer, an aspect ratio of the first electrode or the second electrode with respect to the first conductive layer or the second conductive layer, a size of the first electrode or the second electrode with respect to the first conductive layer or the second conductive layer, or an orientation of the first electrode or the second electrode with respect to the first conductive layer or the second conductive layer.

According to other embodiments, methods of producing an integrated circuit are provided.

According to one exemplary method, a substrate having a heat source disposed in the substrate and a conductive digit line are provided. A Magnetic Tunnel Junction ("MTJ") temperature sensor which includes a MTJ core is provided over the heat source and the conductive digit line. A conductive bit line is provided over the MTJ temperature sensor such that the MTJ temperature sensor is disposed between the conductive digit line and the conductive bit line. The MTJ temperature sensor can be fabricated by depositing a first conductive MTJ electrode layer, depositing a free layer, a tunnel barrier layer and a pinned layer on the first conductive MTJ electrode layer, forming the MTJ core by patterning the free layer, the tunnel barrier layer and the pinned layer, and depositing a second conductive MTJ electrode layer on the MTJ core. An inter-level dielectric layer can be deposited over the second conductive MTJ electrode layer, and the conductive bit line can be deposited over the inter-level dielectric layer.

According to one exemplary method, a substrate is provided and a heat source is formed in the substrate from front end layers by a front end fabrication process. The heat source has a temperature which varies. After the front end fabrication process, a Magnetic Tunnel Junction ("MTJ") core is then formed from back end layers by a back end fabrication process. The MTJ core has a resistance value which varies as a function of the temperature and being configured to generate a current which varies based on the resistance value. A conductive digit line can then be deposited. An inter-level dielectric layer can then be deposited over the second conductive MTJ electrode layer, and a conductive bit line can then be deposited over the inter-level dielectric layer such that the temperature sensor is disposed between the conductive digit line and the conductive bit line. A field can then be generated via at least one of the conductive digit line and the conductive bit line to set a temperature versus resistance characteristic of the MTJ core.

According to another exemplary method, a substrate is provided and a heat source is formed in the substrate. The heat source has a temperature. A magnetic random access memory ("MRAM") architecture is formed on the substrate. The MRAM architecture comprises an MRAM cell array and a dummy MRAM cell. The dummy MRAM cell comprises a particular magnetic tunnel junction ("MTJ") core having a resistance value which varies as a function of the temperature. The MTJ core generates a current which varies based on the resistance value.

According to other embodiments, methods of sensing a temperature of a heat source disposed in a substrate of an integrated circuit are provided.

According to one exemplary method, a Magnetic Tunnel Junction ("MTJ") temperature sensor is provided over the heat source. The MTJ temperature sensor comprises an MTJ core configured to generate a current. The value of the current varies based on a resistance value of the particular MTJ core. The resistance value of the MTJ core varies as a function of the temperature of the heat source. A value of the current generated by the MTJ core can then be associated with a corresponding temperature of the heat source. This association can be accomplished, for example, by measuring a value of the current generated by the MTJ core, and associating the value of the current generated by the MTJ core with a corresponding temperature approximately equal to the temperature of the heat source. The value of the current generated by the MTJ core can be associated with a corresponding temperature of the heat source by measuring a value of the current generated by the MTJ core, using a resistance versus current characteristic of the MTJ core to associate the value of the current generated by the MTJ core with a corresponding resistance value of the MTJ core, and using a resistance versus temperature characteristic of the MTJ core to associate the corresponding resistance value of the MTJ core with a corresponding temperature approximately equal to the temperature of the heat source. A conductive digit line can then also be provided. In this case, the MTJ temperature sensor is provided over the heat source and the conductive digit line. A conductive bit line can be provided over the MTJ temperature sensor such that the MTJ temperature sensor is disposed between the conductive digit line and the conductive bit line. Thereafter, the resistance versus temperature characteristic of the MTJ core can be programmed, for example, by using at least one the conductive digit line and the conductive bit line.

According to another exemplary method, a method of sensing a temperature generated by a heat source is provided which comprises providing a dummy MRAM cell over the heat source, the dummy MRAM cell having a resistance value which varies as a function of the temperature sensed by the dummy MRAM cell; generating a current in the dummy MRAM cell which depends on the resistance value of the dummy MRAM cell; and using a value of the current generated by the dummy MRAM cell to determine the temperature of the heat source. In one implementation, the dummy MRAM cell comprises a free layer, a tunnel barrier layer and a pinned layer disposed between a first electrode and a second electrode.

According to another exemplary method, a method of sensing a temperature of a heat source is provided. This method includes generating a current in a magnetic tunnel junction ("MTJ") core, measuring a value of a current generated by the MTJ core; and determining the temperature of the heat source based on the value of the current. The temperature of the heat source can be determined based on the value of the current, for instance, by determining a resistance value of the MTJ core that corresponds to the value of the current; and determining the temperature of the heat source based on the resistance value of the MTJ core. The resistance value of the MTJ core can be determined, for example, by using a resistance versus current characteristic of the MTJ core to determine a resistance value of the MTJ core that corresponds to the value of the current. The temperature of the heat source can be determined based on the resistance value of the MTJ core by using a resistance versus temperature characteristic of the MTJ core to determine the temperature of the heat source based on the resistance value of the MTJ core.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. An integrated circuit device, comprising:
    a substrate;
    an active circuit component formed within the substrate, wherein said active circuit component generates heat energy and has a temperature;
    a dummy MRAM cell disposed proximate said active circuit component, wherein said dummy MRAM cell includes a particular magnetic tunnel junction ("MTJ") core having a resistance value that varies with the temperature of said active circuit component, wherein said particular MTJ core is configured to sense the temperature of the active circuit component and generate a current that correlates to the temperature of the active circuit component.

2. An integrated circuit device according to claim 1, wherein said particular magnetic tunnel junction core responds to changes in the temperature of the active circuit component.

3. An integrated circuit device according to claim 1, wherein the resistance value of the particular magnetic tunnel junction core varies in response to changes of the heat energy applied to the particular magnetic tunnel junction core by the active circuit component.

4. An integrated circuit device according to claim 3, wherein a resistance value of said particular magnetic tunnel junction core varies substantially linearly as a function of the temperature of the active circuit component.

5. An integrated circuit device according to claim 1, wherein the current varies based on a resistance value of the particular magnetic tunnel junction core.

6. An integrated circuit device according to claim 1, further comprising:
    a temperature sensor circuit configured to associate the current generated by the particular magnetic tunnel junction core with a corresponding temperature which indicates the temperature of the active circuit component.

7. An integrated circuit device according to claim 1, further comprising:
    an MRAM cell array, comprising:
    a plurality of MRAM cells, wherein each of said plurality of MRAM cells comprises a first conductive layer, a second conductive layer, and a magnetic tunnel junction ("MTJ") core formed between said first conductive layer and said second conductive layer of said MRAM cell array, wherein the dummy MRAM cell further comprises the first conductive layer and the second conductive layer, and wherein the particular MTJ core is disposed between said first conductive layer and said second conductive layer such that each MTJ core is the same as the particular MTJ core of the dummy MRAM cell, and
    wherein said active circuit component is formed from front end layers by a front end fabrication process, wherein said MRAM cell array and said particular MTJ core are formed from back end layers by a back end fabrication process which occurs after the front end fabrication process, and wherein the particular MTJ core is formed above said active circuit component and thermally coupled to said active circuit component.

8. An integrated circuit device according to claim 1, said active circuit component comprising a power circuit component.

9. An integrated circuit device according to claim 1, said active circuit component comprising a power control component.

10. An integrated circuit device according to claim 1, said active circuit component comprising a logic component.

11. An integrated circuit device according to claim 1, wherein said particular MTJ core comprises:
    a first electrode; and
    a second electrode, and
    wherein a resistance versus temperature characteristic of said particular MTJ core varies based on at least one of:
    a location of the first electrode or the second electrode with respect to a first conductive layer or a second conductive layer,
    proximity of the first electrode or the second electrode with respect to the first conductive layer or the second conductive layer,
    an aspect ratio of the first electrode or the second electrode with respect to the first conductive layer or the second conductive layer,
    a size of the first electrode or the second electrode with respect to the first conductive layer or the second conductive layer, and
    an orientation of the first electrode or the second electrode with respect to the first conductive layer or the second conductive layer.

12. An integrated circuit device according to claim 11, wherein the first conductive layer further comprises:
    a first magnetic shielding layer disposed below the particular MTJ core, and
    wherein the second conductive layer further comprises:
    a second magnetic shielding layer disposed above the particular MTJ core.

13. An integrated circuit device, comprising:
    a substrate;
    an active circuit component formed within the substrate and having a temperature that varies based on heat energy generated by said active circuit component;
    a magnetic random access memory ("MRAM") architecture formed on said substrate, said MRAM architecture comprising an MRAM cell array and a dummy MRAM cell for sensing the temperature of said active circuit component, the dummy MRAM cell comprising a particular magnetic tunnel junction ("MTJ") core formed above said active circuit component, wherein the particular MTJ core is configured to sense the temperature of the active circuit component and generate a current that correlates to the temperature of the active circuit component.

14. An integrated circuit device according to claim 13, further comprising:
    a temperature sensor circuit configured to associate a value of the current with a corresponding temperature of the active circuit component.

* * * * *